(12) United States Patent
Taft et al.

(10) Patent No.: US 6,407,596 B1
(45) Date of Patent: Jun. 18, 2002

(54) APPARATUS AND METHOD FOR A CLOCK PERIOD SUBDIVIDER

(75) Inventors: Robert Callaghan Taft, Munich (DE); Chris William Papalias, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/825,508

(22) Filed: Apr. 3, 2001

(51) Int. Cl.[7] .............................................. H03B 19/00
(52) U.S. Cl. ...................... 327/116; 327/119; 327/173; 331/53; 708/103
(58) Field of Search ............................. 327/113, 114, 327/116, 119, 124, 101, 165, 166, 172, 173, 291, 299; 377/47, 48; 331/50, 53; 708/101, 103

(56) References Cited

U.S. PATENT DOCUMENTS 6,121,811 A * 9/2000 Scott et al. .................. 327/276

OTHER PUBLICATIONS

Tursi et al., "A 100 MSPS 8–b CMOS Subranging ADC with parametric operation from 3.8V down to 2.2V," *CICC*, May 2000, 4 pages.*

Bazes, "A Novel Precision MOS Synchronous Delay Line, "*IEEE Journal of Solid–State Circuits*, Dec. 1985, pp. 1265–1271.

Watanabe et al., "A New CR–Delay Circuit Technology for High–Density and High–Speed DRAM's," *IEEE Journal of Solid–State Circuits*, Aug. 1989, pp. 905–910.

Maneatis, "Low–Jitter Process–Independent DLL and PLL Based on Self–Biased Techniques," *IEEE Journal of Solid–State Circuits*, Nov. 1996, pp. 1723–1732.

Taft et al., "A 100–MSPS 8–b CMOS Subranging ADC with parametric operation from 3.8 V down to 2.2 V," *CICC*, May 2000, 4 pages.

* cited by examiner

*Primary Examiner*—Timothy P. Callahan
*Assistant Examiner*—Minh Nguyen
(74) *Attorney, Agent, or Firm*—Merchant & Gould PC; John W. Branch (57) ABSTRACT

An electronic circuit generates additional clock edges from a reference clock signal utilizing switch-capacitor techniques. The electronic circuit includes a first capacitance circuit and a second capacitance circuit separated by a switch. During a first time period, the switch is open and the first capacitance circuit is charged. During a second time period, the switch is closed and at least a portion of the charge stored in the first capacitance circuit is transferred to the second capacitance circuit. The amount of charge transferred depends upon the relative sizes of the capacitance circuits. During another time period, the second capacitance circuit is discharged until its associated potential reaches a threshold level corresponding to a threshold set by a level detector. Upon reaching the threshold level, the level detector outputs a logic signal. A high frequency clock signal is produced by combining the logic signal with the reference clock signal.

23 Claims, 6 Drawing Sheets

APPARATUS AND METHOD FOR A CLOCK PERIOD SUBDIVIDER

FIELD OF THE INVENTION

The present invention relates to a apparatus and method for a delay generator. In particular, the present invention relates to a apparatus and method that generates a delay in order to subdivide a clock period.

BACKGROUND OF THE INVENTION

A master clock signal is often used to generate timing signals in integrated circuits. The master clock provides two well-defined edges, a rising edge and falling edge. The rising edge and falling edge define the clock high (logic "1") and clock low (logic "0") time. The clock high and clock low time are each approximately one half of a full clock period in duration. Certain circuit functions may require a clock signal that is faster than the half-period of the master clock signal. These circuit functions are clocked at a higher rate by creating additional signals from the master clock signal. A fast clock signal can be created by delaying one of the master clock signal's edges using a delay circuit. The delayed clock edge may be combined with the master clock signal to create a higher frequency clock signal.

Fixed delay elements are one method for creating a delay in the master clock edge. Fixed delay elements include inverter chains and/or RC time circuits. A high frequency clock can be generated by combining the delayed clock signal with the original clock signal. Fixed delay elements provide a delay that does not change with variations in the master clock period. The delay time of the fixed delay elements is affected by process changes, power supply variations, and temperature variations.

Delay-Lock Loops (DLL's) and Phase-Lock Loops (PLL's) are another method for creating a delay in the master clock edge. A DLL or PLL includes a Voltage-Controlled Oscillator (VCO) or Voltage-Controlled Delay element (VCDL), a phase and/or frequency detector, charge-pump, and loop filter.

Synchronous Delay Lines (SDL) are yet another method for creating a delay in the master clock edge. To reliably subdivide the period of the master clock the SDL explicitly uses feedback control. Negative feedback control of the SDL reduces sensitivity to supply-voltage variations, temperature changes, and processing variations.

SUMMARY OF THE INVENTION

Briefly stated, in accordance with the present invention an electronic circuit generates additional clock edges from a reference clock signal utilizing switch-capacitor techniques. The electronic circuit includes a first capacitance circuit and a second capacitance circuit separated by a switch. During a first time period, the switch is open and the first capacitance circuit is charged. During a second time period, the switch is closed and at least a portion of the charge stored in the first capacitance circuit is transferred to the second capacitance circuit. The amount of charge transferred depends upon the relative sizes of the capacitance circuits. During another time period, the second capacitance circuit is discharged until its associated potential reaches a threshold level corresponding to a threshold set by a level detector. Upon reaching the threshold level, the level detector outputs a logic signal. A high frequency clock signal is produced by combining the logic signal with the reference clock signal.

According to a feature of the invention, an apparatus for generating an output signal from a reference clock signal, includes: a first capacitance circuit, a second capacitance circuit, and a charge circuit that charges the first capacitance circuit in response to a first control signal. A discharge circuit discharges the second capacitance circuit in response to a second control signal. A switch circuit transfers at least a portion of a charge stored in the first capacitance circuit to the second capacitance circuit in response to a third control signal. A detector circuit produces a trigger output signal in response to a potential in the second capacitance circuit. A control logic circuit generates the first, second and third control signals in response to the reference clock signal and the trigger output signal. The control logic circuit also generates the output signal in response to the trigger output signal and the reference clock signal.

According to another feature of the invention, a method of generating a high frequency clock signal from a reference clock signal includes: charging a capacitance circuit over a time interval, transferring a portion of a charge from the capacitance circuit to another capacitance circuit over another time interval, discharging one of the capacitance circuits over yet another time interval, detecting a potential in one of the capacitance circuits to produce a logic output, and combining the logic output with the reference clock signal to generate the high frequency clock.

According to yet another feature of the invention, an apparatus for generating a high frequency clock signal from a reference clock signal includes: a charge storage means, a means for producing a current, a means for selectively coupling the current to the charge storage means during a time interval, another charge storage means, a means for selectively coupling a portion of a charge stored in the charge storage means to the another charge storage means during another time interval, a means for producing a logic signal by detecting a potential of a node in one of the charge storage means and the another charge storage means, and a means for selectively discharging the node that is responsive to the logic signal. The apparatus may also include a means for producing the high frequency clock signal responsive to the logic signal.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The present invention is directed to a switched-capacitor circuit that is configured to generate a high frequency clock signal from a reference clock signal. The high frequency clock signal is generated by subdividing the reference clock signal to generate clock edges that are in addition to the rising and falling edges of the reference clock signal. The additional clock edges are then combined with the reference clock signal to generate the high frequency clock. The additional clock edges are maintained in a precise relationship with the reference clock signal for an accurate high frequency clock signal.

The present invention has three operational periods associated with the reference clock signal for steady-state operation. During the first period, referred to as the "charging period", a first capacitance circuit is charging. The charging occurs for at least a portion of the period that the reference clock signal has a low value. The second period, referred to as the "charge transfer period", commences when the reference clock signal transitions to high logic level. During the second period, the charge on the first capacitance circuit is transferred to the second capacitance circuit. During this charge transfer period, the total charge is "shared" between the two capacitance circuits. The charge is transferred until the charge on each capacitance circuit reaches an equilibrium or "settled" value. The settled value of the charge for each capacitance circuit is determined by the relative sizes of each capacitance circuit. The settled charge on the second capacitance circuit is discharged during a third period, referred to as the "discharging period". Discharging proceeds until a threshold level is reached, or shortly after the threshold level is reached.

The length of the charging and discharging operational periods depend upon the length of each previous charging and discharging operational periods. The length of the discharging period for the next reference clock cycle, depends upon the length of the charging period for the previous reference clock period. By referring to the previous reference clock period, a precise relationship can be maintained between the period of the high frequency clock signal and the reference clock signal.

The present invention is also independent of power supply variations and variations in the threshold voltages of the components. The period of the high frequency clock signal is related to the reference clock signal based upon the ratio of the capacitors and the ratio of the currents within each circuit. Since the circuit timing and performance are based on ratios, absolute values of capacitance and current are not critical. The ratios of the capacitors remain the same despite the values of the components changing over processing and other factors. Similarly, ratios in the current remain relatively constant over processing and power supply changes. Insensitivity may be achieved through other circuits like delay-locked loops and synchronous delay lines at the expense of higher complexity and increased cost. However, the present invention achieves the insensitivity with relatively few elements, and reduced complexity.

Figure 1:
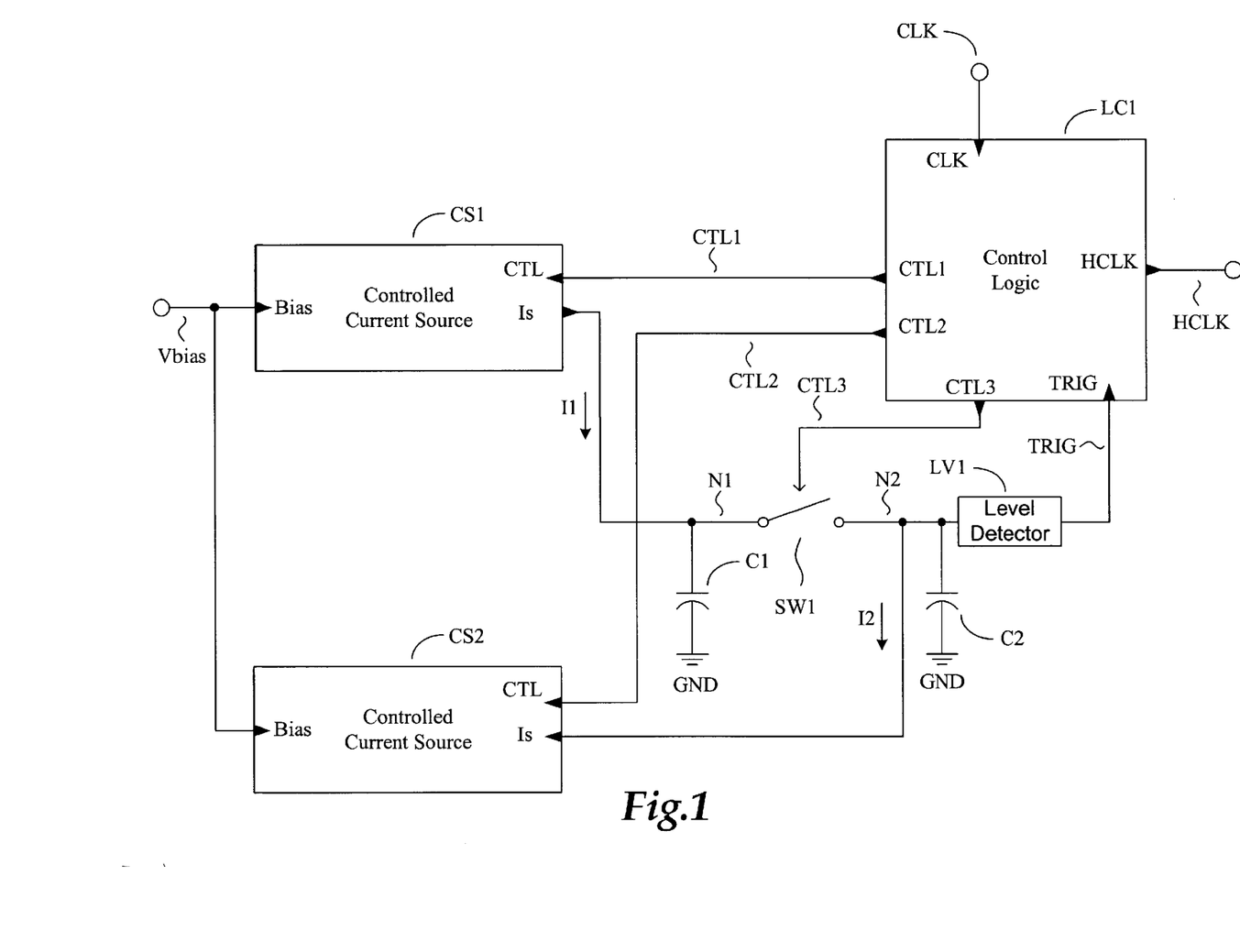
FIG. 1 illustrates a schematic diagram of a switch-capacitor circuit configured to subdivide a clock signal.

FIG. 1 illustrates a schematic diagram of a switch-capacitor circuit configured to subdivide a clock signal in accordance with the present invention. The switch-capacitor circuit includes a first and second controlled current source (CS1, CS2), a level detector circuit (LV1), a first and a second capacitor (C1, C2), a switch (SW1) and a control logic circuit (LC1).

The first controlled current source (CS1) produces a first current (I1) in response to a bias signal (Vbias) and a control signal (CTL1). The first current (I1) is coupled to a first node (N1). The second controlled current source (CS2) produces a second current (I2) in response to the bias signal (Vbias) and another control signal (CTL2). The first current (I1) is coupled to another node (N2). The first capacitor (C1) is coupled between the first node (N1) and a ground terminal (GND). The second capacitor (C2) is coupled between the second node (N2) and the ground terminal (GND). The switch (SW1) is series coupled between the first node (N1) and the second node (N2). The switch (SW1) is responsive to a third control signal (CTL3). The level detector circuit (LV1) produces an output (TRIG) in response to the potential at the second node (N2). The control logic circuit (LC1) produces the control signals (CTL1, CTL2, CTL3) in response to the reference clock signal (CLK) and the output of the level detector (TRIG). Also, the control logic circuit (LC1) uses the reference clock signal (CLK) and the output of the level detector circuit (TRIG) to generate a high frequency clock signal (HCLK).

The controlled current sources discussed above (CS1, CS2) may be implemented using biased current sources combined with switching devices or logic. For example, the first controlled current source may include a P-type MOS current source transistor that is series connected to a P-type MOS switching device. When the P-type MOS switching device is active, current flows through the switching device into the first node (N1). Other transistors, logic, and passive electronic components may be arranged to provide a controlled current source in accordance with the present invention.

During operation, the first control signal (CTL1) activates the first controlled current source (CS1) to charge the first capacitor (C1). Charge is transferred from the first capacitor (C1) to the second capacitor (C2) when the switch (SW1) is closed in response to the third control signal (CTL3). In one embodiment, the potentials at the first node and the second node (N2) settle to a value roughly halfway between the power supply potentials. The second capacitor (C2) is discharged by the second controlled current source (CS2) in response to the second control signal (CTL2). The level detector (LV1) produces a logic signal output (TRIG) when the potential at the second node (N2) reaches a predetermined level. The control logic (LC1) generates the control signals (CTL1, CTL2, CTL3) that are necessary to produce the high frequency lock (HCLK) from the reference clock signal (CLK) and the output of the level detector (TRIG). It is appreciated that controlled current source CS1 can be replaced by another type of charging circuit and controlled current source CS2 can be replaced by another type of discharging circuit for the present invention. This operation of the switched capacitor circuit discussed above will be discussed below with reference to FIG. 2.

In light of the description contained herein, it is also understood and appreciated that that the switched capacitor circuit can operate in the opposite direction. The first capacitor (C1) is discharged (rather than charged) by a controlled current source in response to the first control signal (CTL1). Charge is transferred in the opposite direction, from the second capacitor (C1) to the first capacitor (C2) when the switch (SW1) is closed in response to the third control signal (CTL3). The second capacitor (C2) is charged (rather than discharged) by another controlled current source in response to the second control signal (CTL2). The level detector (LV1) produces a logic signal output (TRIG) when the potential at the second node (N2) reaches a predetermined level.

Figure 2:
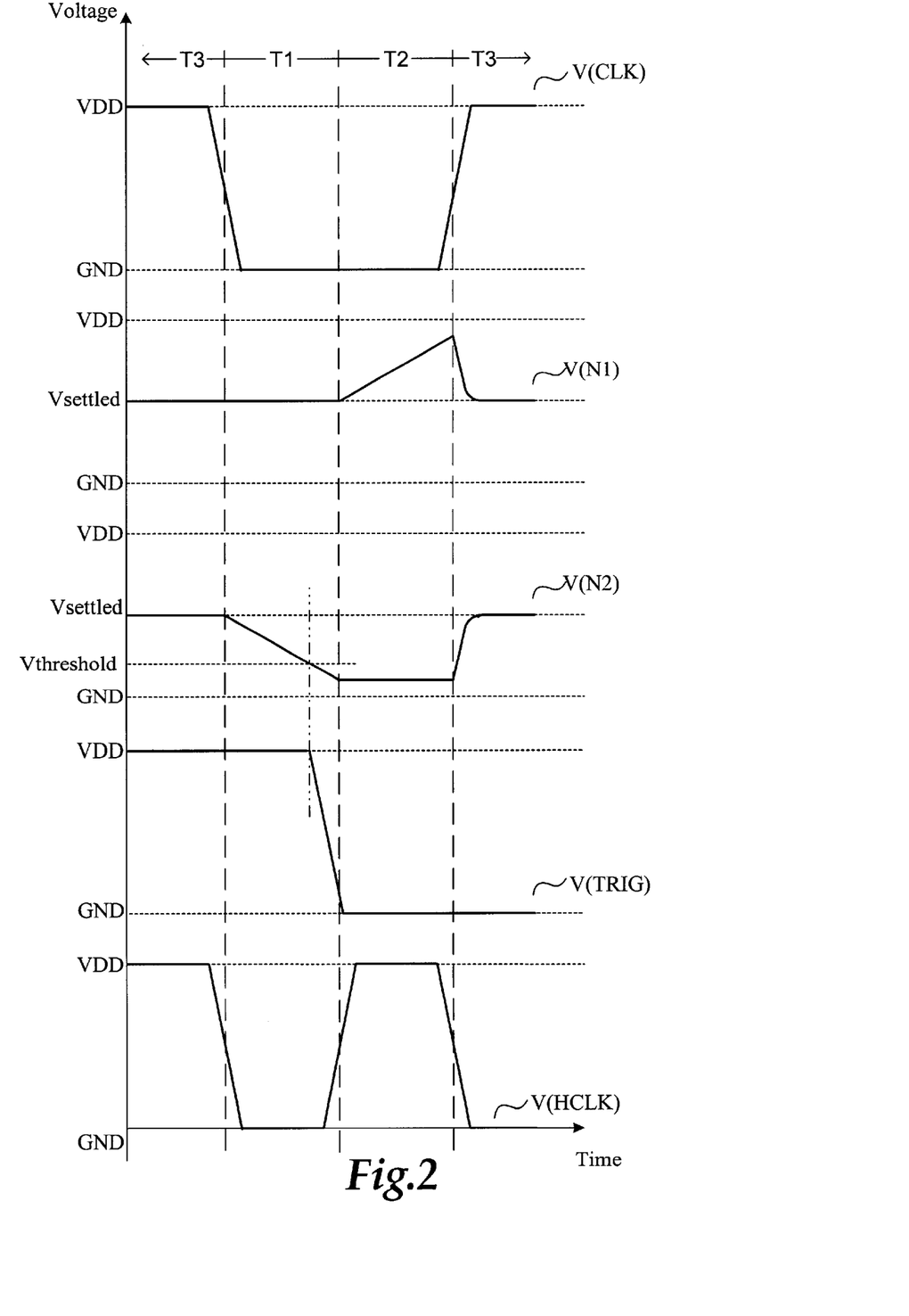
FIG. 2 shows a graph of the waveform relationships for a switched-capacitor circuit configured to subdivide a clock signal.

FIG. 2 illustrates a graph of the waveform relationships for the switched-capacitor circuit shown in FIG. 1. The graph includes the voltage responses for the reference clock signal (CLK), the first node (N1), the second node (N2), the output of the level detector (TRIG), and the high frequency clock (HCLK).

The three steady-state operational periods for the circuit of FIG. 1 are shown in the graph. The discharge period (T1) begins when the reference clock signal (CLK) transitions from a high potential (VDD) to a low potential (GND). During the discharge period (T1), the potential at the second node (N2) begins to decrease as capacitor C2 is being discharged by current I2. When the potential of the second node (N2) reaches the threshold value (Vthreshold), the output level of the level detector (TRIG) transitions from one logic level to another. In this example, V(TRIG) transitions from a high value of VDD to a low value of GND. It is appreciated that the circuit can be arranged such that V(TRIG) transitions from a low logic level to a high logic level, or transitions between values different from VDD and GND. Once V(TRIG) transitions from VDD to GND, controlled current source CS2 is disabled by control signal CTL2 such that capacitor C2 stops discharging. The transition of V(TRIG) ends the discharging period (T1) and begins the charging period (T2).

During the charging period (T2), the potential of the second node (N2) remains at or near the threshold potential until the reference clock signal (CLK) transitions from a low logic level to a high logic level. Also, the potential of the first node (N1) increases by charging capacitor C1 with current I1. The potential of the first node (N1) continues to increase until controlled current source CS1 is disabled by control signal CTL1. Control signal CTL1 disables controlled currents source CS1 when the reference clock signal (CLK) transitions from a low logic level to high logic level. The low to high transition of the reference clock signal (CLK) ends the charging period (T1) and begins the charge transfer period (T3).

During the charge transfer period (T3), switch SW1 is closed by the third control signal (CTL3), causing capacitor C1 to transfer charge to capacitor C2. The charge is transferred until the charge on each capacitor (C1, C2) reaches a settled value (Vsettled). The value of Vsettled depends upon the relative sizes of the capacitors (C1, C2). In one embodiment, the relative sizes of the capacitors (C1, C2) are equal. In another embodiment, the capacitors (C1, C2) are unequal.

Figure 3:
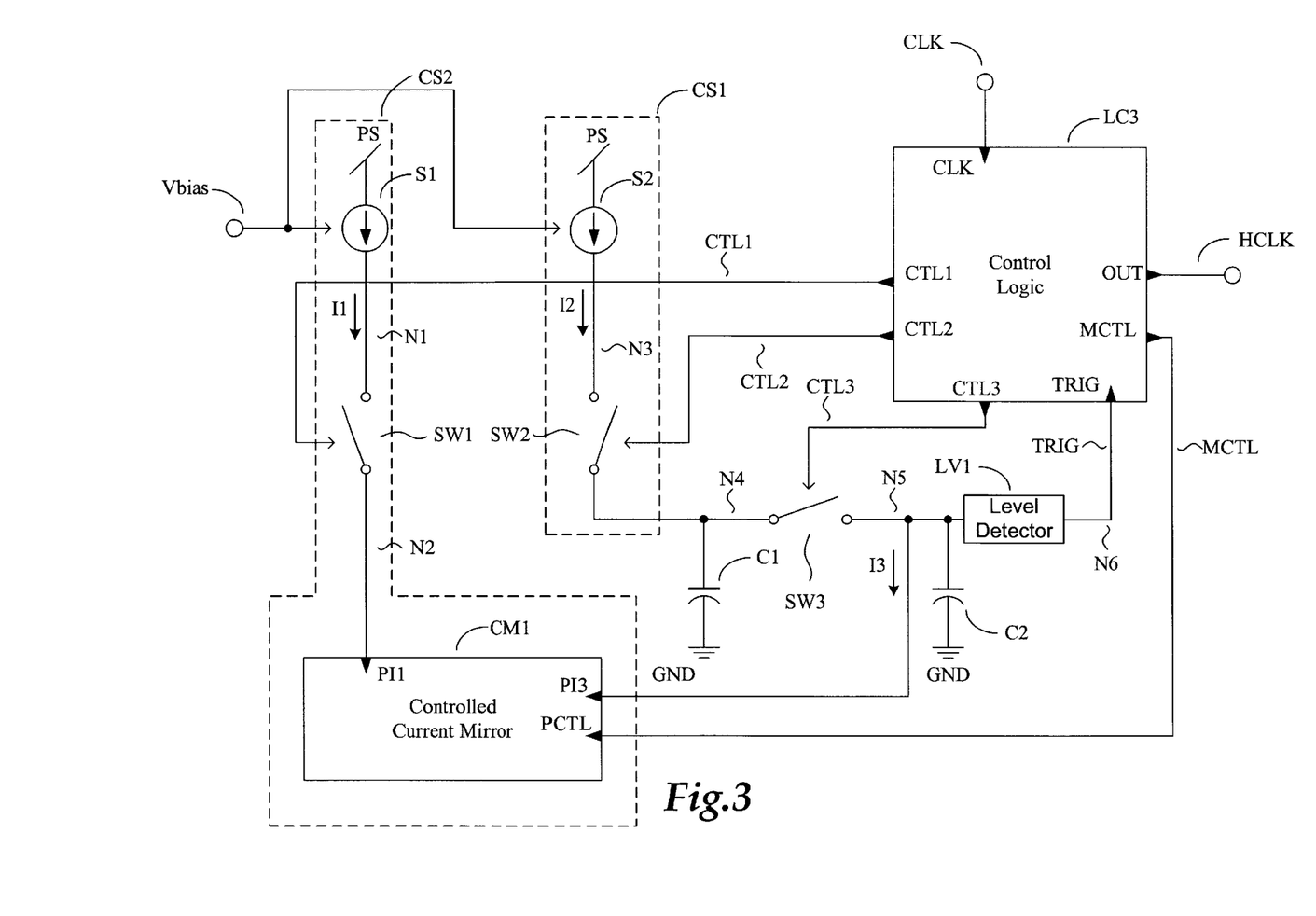
FIG. 3 illustrates a first detailed example schematic diagram for the switch-capacitor circuit of FIG. 1.

FIG. 3 is a first detailed example of the switched capacitor circuit of FIG. 1. The switch-capacitor circuit includes current source circuits (S1 and S2), a controlled current mirror (CM1), capacitances (C1 and C2), switch circuits (SW1, SW2, and SW3), a level detector circuit (LV1), and a control logic circuit (LC3). In FIG. 3, controlled current source CS1 from FIG. 1 includes current source S2 and switch SW2, and controlled current source CS2 includes current source S1, switch SW1, and controlled current mirror CM1.

Current source S1 is coupled between a power supply terminal (PS) and a first node (N1). Current source S1 supplies a first current (I1) in response to a bias signal (Vbias). Switch SW1 is series coupled between the first node (N1) and a second node (N2). Switch SW1 is responsive to a first control signal (CTL1). The second node (N2) is coupled to the controlled current mirror (CM1) through an input port (PI1). Current source S2 is coupled between the power supply terminal (PS) and a third node (N3). Current source S2 supplies a second current (I2) in response to a bias signal (Vbias). Switch SW2 is series coupled between the third node (N3) and a fourth node (N4). Switch SW2 is responsive to a second control signal (CTL2). Capacitor C1 is coupled in series between the fourth node (N4) and a ground terminal (GND). Switch SW3 is coupled in series between the fourth node (N4) and a fifth node (N5). Switch SW3 is responsive to a third control signal (CTL3). Capacitor C2 is coupled in series between the fifth node (N5) and GND. The controlled current mirror (CM1) causes a third current (I3) to flow in response to the first current (I1) and a mirror control signal (MCTL). The third current (I3) flows from the fifth node (N5) to an input port (PI3) of the controlled current mirror (CM1). A level detector circuit (LV1) is coupled in series between the fifth node (N5) and a sixth node (N6). The level detector circuit (LV1) produces an output signal (TRIG) in response to the potential at the fifth node (N5). The control logic circuit (LC3) produces the control signals (CTL1, CTL2, CTL3, MCTL) in response to the reference clock signal (CLK) and the output of the level detector circuit (TRIG). Also, the control logic circuit (LC3) uses the reference clock signal (CLK) and the output of the level detector circuit (TRIG) to generate a high frequency clock signal (HCLK).

The steady-state operation of the embodiment described in connection with FIG. 3 includes at least three operational periods as previously discussed above. The operational periods include: a charging period, a charge transfer period, and a discharging period.

During the charging period of the circuit in FIG. 3, switch SW1 is open, switch SW2 is closed, and switch SW3 is open. As switch SW2 is closed, the second current (I2) flows from current source S2 to the fourth node (N4). The current (I2) charges capacitor C1. Capacitor C1 continues to charge until switch SW2 is opened by control signal CTL2. In one exemplary embodiment, control signal CTL2 triggers switch SW2 open when the reference clock signal (CLK) transitions from a low logic level to a high logic level.

During the transfer period of the circuit in FIG. 3, switch SW1 is open, switch SW2 is open, and switch SW3 is closed. In one exemplary embodiment, when the reference clock signal (CLK) transitions from a low logic level to a high logic level, the charging period ends and the charge transfer period begins. Switch SW3 is closed by control signal CTL3. When switch SW3 closes, the charge on capacitor C1 is transferred to capacitor C2. If the capacitors (C1, C2) are equal in size, capacitor C1 continues to transfer charge to capacitor C2 until the total charge is shared equally between the capacitors (C1, C2). The charge sharing of the capacitors (C1, C2) also results in the potentials of the fourth node (N4) and the fifth node (N5) settling at an equal value. The potentials of the nodes (N4, N5), and charge values of the capacitors (C1, C2), remain approximately equal when switch SW3 is opened by control signal CTL3. In one exemplary embodiment, control signal CTL3 triggers switch SW3 open when the reference clock signal (CLK) transitions from a high logic level to a low logic level.

During the discharging period of the circuit in FIG. 3, switch SW1 is closed, switch SW2 is open, and switch SW3 is open. In one exemplary embodiment, when the reference clock signal transitions from a high logic level to a low logic level, the discharging period begins. Switch SW1 is closed by control signal CTL1. When switch SW1 closes, current I1 feeds in port PI1 of controlled current mirror CM1. When switch SW1 is closed, current I1 is mirrored by controlled current mirror CM1 to the current (I3) at port PI3. While capacitor C2 has a charge therein, and depending on the state of control signal MCTL, current I3 is drawn from the fifth node (N5). The current (I3) flowing from the fifth node (N5) discharges capacitor C2. As capacitor C2 discharges the potential at the fifth node (N5) decreases. The potential at the fifth node (N5) continues to decrease until either MCTL changes states, switch SW1 is opened, or the potential of the fifth node (N5) reaches the ground potential. In one exemplary embodiment, MCTL changes states when the output of the level detector circuit (LV1) changes states. The output of the level detector circuit (LV1) changes states when the potential at the fifth node (N5) reaches a threshold level of the level detector circuit (LV1).

More specifically described, when the voltage value at the fifth node (N5) reaches the threshold potential of level detector circuit LV1, the level detector circuit (LV1) outputs a signal (TRIG) into control logic LC3. In one example, when control logic LC3 receives the signal (TRIG), a control signal (MCTL) is activated. The control signal (MCTL) flows to an input port (PCTL) of controlled current mirror CM1. When controlled current mirror CM1 receives the control signal (MCTL), controlled current mirror CM1 terminates current I3 from discharging capacitor C2. By terminating the discharge of capacitor C2, the potential of the fifth node (N5) settles at a potential that is approximately the same as the threshold level of level detector circuit LV1.

In one exemplary embodiment, control signal CTL2 of the control logic (LC3) is activated when control logic LC3 receives the TRIG signal. Control signal CTL2 closes SW2 beginning the charging period described above.

The charging, charge transfer, and discharging of the capacitors (C1, C2) results in a signal (TRIG) that transitions from a high logic level to a low logic level subdividing the clock low period of the clock signal input (CLK). Using logic elements within the control logic (LC3), the signal (TRIG) is combined with the reference clock signal (CLK) to produce an output signal. The combination of the two signals (TRIG, CLK) results in a high frequency signal (HCLK) that has a higher frequency than the reference clock signal (CLK).

In light of the description contained herein, it is also understood and appreciated that rather than subdividing the clock low period of the clock signal input (CLK), the circuit can be modified to subdivide the clock high period of the clock signal input (CLK).

The currents (I1, I2) provided by the current sources (S1, S2) are controlled by the bias input (Vbias). As the frequency of the reference clock signal (CLK) increase, the time interval available for the currents (I1, I2) to charge and discharge the capacitors (C1, C2) decreases. To compensate for the decrease in available time, the currents (I1, I2) are increased to charge the capacitors (C1, C2) at a faster rate. In one embodiment, the bias input (Vbias) is automatically adjusted as the frequency of the reference clock (CLK) changes so the currents (I1, I2) are approximately proportional to the frequency of the reference clock signal (CLK). In another embodiment of the present invention, the bias input (Vbias) is generated by a band gap circuit. In yet another embodiment, the bias input (Vbias) is generated by another type of bias circuit.

In another embodiment, the capacitors (C1, C2) can be a bank of capacitors. The capacitors can be of any type, including but not limited to MOS capacitors, single-layer ceramic chip capacitors, film-type capacitors, planar metal capacitors, and metal interdigitated capacitors. Each of the capacitors (C1, C2) can be split across the power supply rails to maximize power supply rejection. In another embodiment, the level detector circuit (LV1) can be incorporated into the control logic (LC3). In addition, the control logic (LC3) can be configured to supply a different output signal than the high frequency signal (HCLK). The control logic (LC3) can supply an output signal where signal TRIG is not combined with the reference clock signal (CLK). Also, the TRIG signal can be used as the output signal for the circuit.

Figure 4:
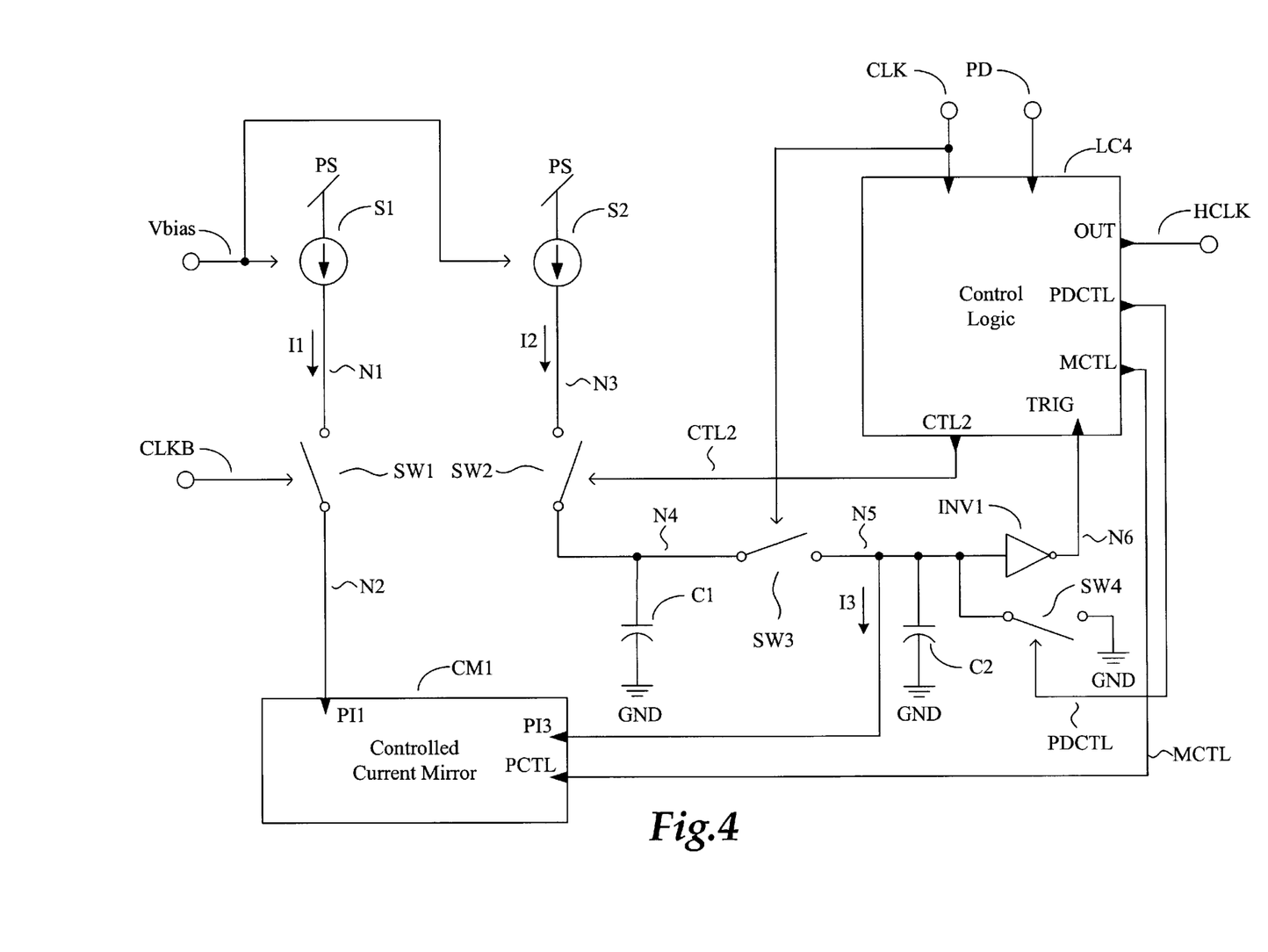
FIG. 4 shows another detailed example schematic diagram for the switched-capacitor circuit of FIG. 1 including a power-down switch.

FIG. 4 is another detailed example of the switched capacitor circuit of FIG. 1 that further includes a power-down switch. The switch-capacitor circuit includes current source circuits (S1 and S2), a controlled current mirror (CM1), capacitances (C1 and C2), switch circuits (SW1, SW2, SW3, and SW4), an inverter circuit (INV1), and a control logic circuit (LC4).

Current source S1 is coupled between a power supply terminal (PS) and a first node (N1). Current source S1 supplies a first current (I1) in response to a bias signal (Vbias). Switch SW1 is series coupled between the first node (N1) and a second node (N2). Switch SW1 is responsive to an inverse logic signal of the reference clock signal (CLKB). The second node (N2) is coupled to the controlled current mirror (CM1) through an input port (PI1) Current source S2 is coupled between the power supply terminal (PS) and a third node (N3). Current source S2 supplies a second current (I2) in response to a bias signal (Vbias). Switch SW2 is series coupled between the third node (N3) and a fourth node (N4). Switch SW2 is responsive to a first control signal (CTL2). Capacitor C1 is coupled in series between the fourth node (N4) and a ground terminal (GND). Switch SW3 is coupled in series between the fourth node (N4) and a fifth node (N5). Switch SW3 is responsive to the reference clock signal (CLK). Capacitor C2 is coupled in series between the fifth node (N5) and GND. The controlled current mirror (CM1) causes a third current (I3) to flow in response to the first current (I1) and a second control signal (MCTL). The third current (I3) flows from the fifth node (N5) to an input port (PI3) of the controlled current mirror (CM1). Switch SW4 is coupled in series between the fifth node (N5) and GND. Switch SW4 is responsive to a third control signal (PDCTL). An inverter circuit (INV1) is coupled in series between the fifth node (N5) and a sixth node (N6). The inverter circuit (INV1) produces an output signal (TRIG) in response to the potential at the fifth node (N5). The control logic circuit (LC4) produces the control signals (CTL2, MCTL, PDCTL) in response to the second reference clock signal (CLK), the output of the level detector circuit (TRIG), and a power-down input (PD). Also, the control logic circuit (LC4) uses the reference clock signal (CLK) and the output of the level detector circuit (TRIG) to generate a high frequency clock signal (HCLK).

The operation of the switch-capacitor circuit in FIG. 4 is similar to the operation of the switch-capacitor circuit of FIG. 3. However, switch SW1 is controlled by the inverse of the reference clock signal (CLKB) rather than a control signal (CTL1). Also, switch SW3 is controlled by the reference clock signal (CLK) rather than a control signal (CTL3). The inverter circuit INV1 is configured to operate as a level detector such as LV1 in FIG. 3. Inverter circuit INV1 may include one or more inverters in series. In addition, switch SW4 operates as a power-down switch in the circuit. During power-down, switch SW4 closes discharging capacitor C2. Switch SW4 closes depending on the state of control signal PDCTL. The state of PDCTL depends on the value of the power-down input (PD). As switch SW4 closes during power-down, any residual charge present on capacitor C2 is discharged to GND. By discharging the residual charge present on capacitor C2 the inverter circuit (INV1) is prevented from being biased in the active region during power down. When the inverter circuit (INV1) is biased in the active region during power down the circuit can experience an undesirable current draw through the inverter circuit (INV1). By including the power-down switch (SW4) the current draw can be prevented.

Figure 5:
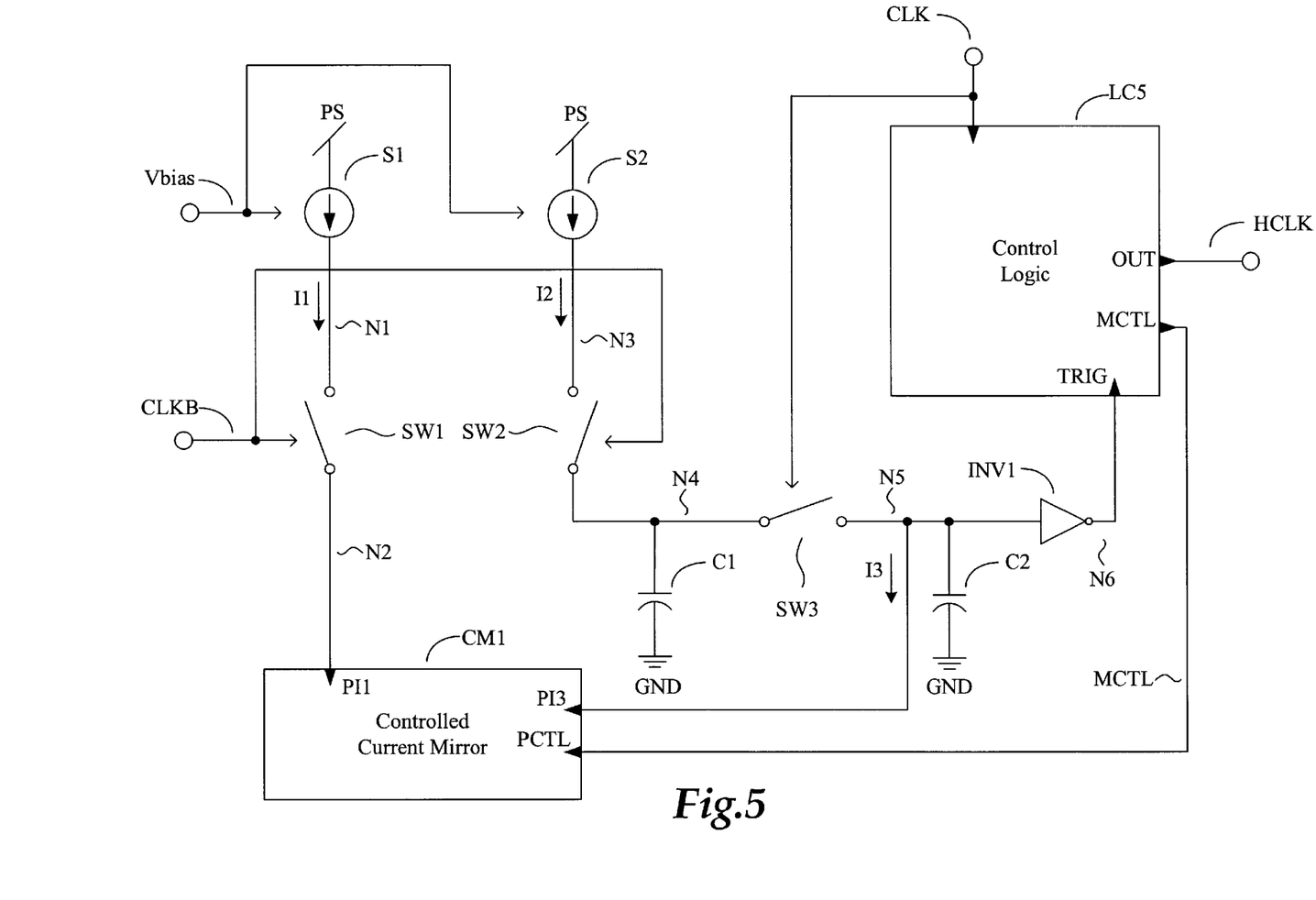
FIG. 5 illustrates another detailed example schematic diagram for the switched-capacitor circuit of FIG. 3 without feedback.

FIG. 5 illustrates another detailed example of the switched-capacitor circuit in FIG. 1 where a reference clock signal replaces feedback to control the charging of the capacitors. The switch-capacitor circuit includes current source circuits (S1 and S2), a controlled current mirror (CM1), capacitances (C1 and C2), switch circuits (SW1, SW2, and SW3), an inverter circuit (INV1), and a control logic circuit (LC4).

Current source S1 is coupled between a power supply terminal (PS) and a first node (N1). Current source S1 supplies a first current (I1) in response to a bias signal (Vbias). Switch SW1 is series coupled between the first node (N1) and a second node (N2). Switch SW1 is responsive to an inverse logic signal of the reference clock signal (CLKB). The second node (N2) is coupled to the controlled current mirror (CM1) through an input port (PI1). Current source S2 is coupled between the power supply terminal (PS) and a third node (N3). Current source S2 supplies a second current (I2) in response to a bias signal (Vbias). Switch SW2 is series coupled between the third node (N3) and a fourth node (N4). Switch SW2 is responsive to the inverse logic signal of the reference clock signal (CLKB). Capacitor C1 is coupled in series between the fourth node (N4) and a ground terminal (GND). Switch SW3 is coupled in series between the fourth node (N4) and a fifth node (N5). Switch SW3 is responsive to the reference clock signal (CLK). Capacitor C2 is coupled in series between the fifth node (N5) and GND. The controlled current mirror (CM1) causes a third current (I3) to flow in response to the first current (I1) and a control signal (MCTL). The third current (I3) flows from the fifth node (N5) to an input port (PI3) of the controlled current mirror (CM1). An inverter circuit (INV1) is coupled in series between the fifth node (N5) and a sixth node (N6). The inverter circuit (INV1) produces an output signal (TRIG) in response to the potential at the fifth node (N5). The control logic circuit (LC5) produces the control signal (MCTL) in response to the second reference clock signal (CLK) and the output of the level detector circuit (TRIG). Also, the control logic circuit (LC5) uses the reference clock signal (CLK) and the output of the level detector circuit (TRIG) to generate a high frequency clock signal (HCLK).

The operation of the switch-capacitor circuit in FIG. 5 is similar to the operation of the switch-capacitor circuit of FIG. 3. However, switch SW1 is controlled by the inverse logic signal of the reference clock signal (CLKB) rather than the CTL1 signal shown in FIG. 3. Also, switch SW3 is controlled by the reference clock signal (CLK) rather than the CTL3 signal of FIG. 3. In addition, switch SW2 is controlled by the inverse logic signal of the reference clock signal (CLKB) rather than a control signal (CTL2). By controlling switch SW2 with the inverse of the reference clock signal (CLKB), the charging period of capacitor C1 begins as soon as the reference clock signal (CLK) transitions to a low logic level. Capacitor C1 continues to charge at a rate corresponding to current I2 as long as the reference clock signal (CLK) remains at a low logic level. In this embodiment, the charging and discharging operational periods overlap since the discharging period also occurs while the reference clock signal (CLK) has a logic low level. Also, the length of the charging period may be longer than the discharging period when the MCTL control signal disables current I3.

Figure 6:
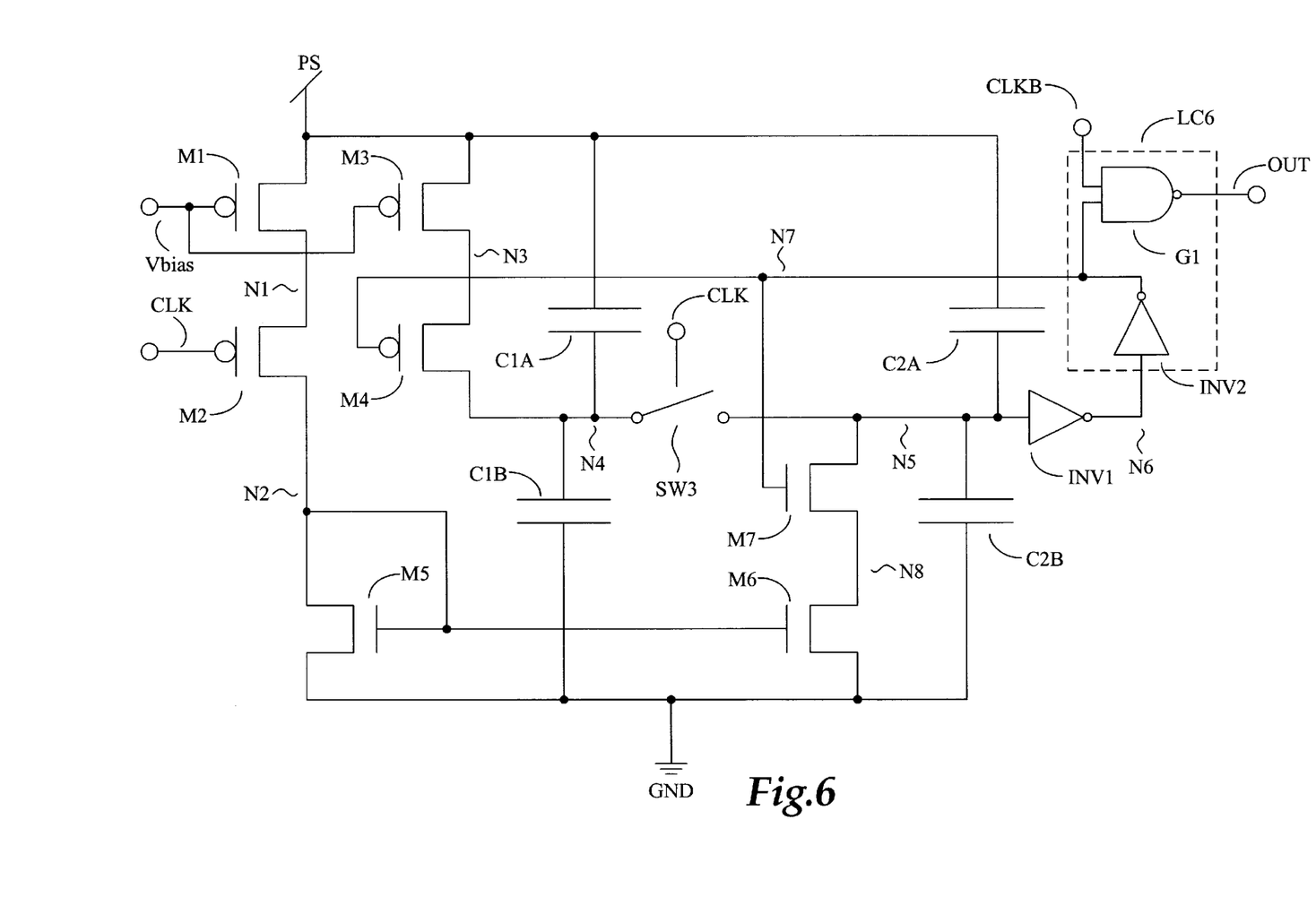
FIG. 6 shows another detailed example schematic diagram for the switched-capacitor circuit of FIG. 3 in accordance with present invention.

FIG. 6 illustrates another exemplary embodiment of the switched-capacitor circuit of FIG. 3 in greater detail. The switched-capacitor circuit includes PMOS transistors (M1–M4), NMOS transistors (M5–M7), a switch (SW3), capacitance circuits (C1A, C1B, C2A, C2B), inverter circuits (INV1, INV2), and a NAND gate (G1).

In comparing the exemplary embodiment of FIG. 6 with the embodiment of FIG. 3, current source S1 is replaced by PMOS transistor M1, switch SW1 is replaced by PMOS transistor M2, current source S2 is replaced by PMOS transistor M3, and switch SW2 is replaced by PMOS transistor M4. Controlled current mirror CM1 of FIG. 3 is replaced by NMOS transistors M5, M6, and M7 for FIG. 6. Capacitor C1 is replaced by capacitance circuits C1A and C1B, and capacitor C2 is replaced by capacitance circuits C2A and C2B. Inverter circuit INV1 replaces level detector (LV1) Control logic LC6, which includes inverter circuit INV2 and NAND gate G1, replaces control logic LC3.

PMOS transistor circuit M1 has a source coupled to a power supply terminal (PS), a drain coupled to a first node (N1), and a gate coupled to a bias line (Vbias). PMOS transistor circuit M2 has a source coupled to the first node (N1), a drain coupled to a second node (N2), and a gate coupled to a reference clock line (CLK). PMOS transistor circuit M3, has a source coupled to the power supply terminal (PS), a drain coupled to a third node (N3), and a gate coupled to the bias line (Vbias). PMOS transistor circuit M4 has a source coupled to the third node (N3), a drain coupled to a fourth node (N4), and a gate coupled to a seventh node (N7). NMOS transistor circuit M5 has a gate and a drain coupled to the second node (N2), and a source coupled to a ground terminal (GND). NMOS transistor circuit M6 has a drain coupled to an eighth node (N8), a source coupled to GND, and a gate coupled to the second node (N2). NMOS transistor circuit M7 has a drain coupled to a fifth node (N5), a source coupled to the eighth node (N8), and a gate coupled to the seventh node (N7). Switch SW3 is coupled in series between node N4 and node N5. Switch SW3 is responsive to the reference clock signal (CLK). Capacitor C1A is coupled between the fourth node (N4) and PS. Capacitor C1B is coupled between the fourth node (N4) and GND. Capacitor C2A is coupled between the fifth node (N5) and PS. Capacitor C2B is coupled between the fifth node (N5) and GND. Inverter INV1 is coupled directionally from the fifth node (N5) to a sixth node (N6). Inverter INV2 is coupled directionally between the sixth node (N6) and the seventh node (N7). Gate GI has one input coupled to the seventh node (N7) and another input coupled to the inverse of the reference clock signal (CLKB). The output of gate GI is the output (OUT) of this exemplary embodiment of the switch-capacitor circuit.

The operation of the switch-capacitor circuit in FIG. 6 is similar to the operation of the switch-capacitor circuit of FIG. 3. However, PMOS transistor M2 is controlled by the reference clock signal (CLK) rather than the CTL1 signal. Also, switch SW3 is controlled by the reference clock signal (CLK) rather than the CTL3 signal. Control logic LC6 also shows one exemplary embodiment for providing the output signal (OUT) and the logic feedback for the circuit. Inverter INV2 inverts the logic level of the output of inverter INV1.

The output of INV2 is coupled to the seventh node (N7) and provides control of PMOS transistor M4 and NMOS transistor M7. The output of INV2 is combined with the inverse logic signal of the reference clock signal (CLKB) by NAND gate (GI) to produce the output signal (OUT).

In this embodiment of the present invention, each set of capacitor circuits (C1A, C1B and C2A, C2B) is configured so that each set is split across the supply terminals (PS, GND). By splitting each set of capacitor circuits (C1A, C1B and C2A, C2B) across the supply terminals (PS, GND), the circuit is able to maximize its power supply rejection ratio. The greater the power supply rejection ratio the less the circuit will be effected by noise or variation in the power supply.

It is appreciated that an inverter circuit (INV1) can be configured to operate as a level detector. Other types of circuits can be configured to operate as a threshold detector in place of inverter circuit INV1 (i.e. a comparator). Also, inverter circuit INV1 can include one or more inverters in series.

It is also appreciated that the current mirror configuration comprised of NMOS transistors M5–M7 shown in FIG. 6 can be replaced by other current mirror configurations. For example, a Wilson type or Widlar type of current mirror can be used in the present invention. Any other type of mirror that is configured such that it can be disabled to terminate the discharge of capacitance circuits C2A and C2B is suitable for the present invention.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for generating an output signal from a reference clock signal, comprising:
   a first capacitance circuit;
   a second capacitance circuit;
   a charge circuit that charges the first capacitance circuit in response to a first control signal;
   a discharge circuit that discharges the second capacitance circuit in response to a second control signal;
   a switch circuit that transfers at least a portion of a charge stored in the first capacitance circuit to the second capacitance circuit in response to a third control signal;
   a detector circuit that produces a trigger output signal in response to a potential in at least one of the first capacitance circuit and the second capacitance circuit; and
   a control logic circuit that generates the first, second and third control signals in response to the reference clock signal and the trigger output signal, the control logic circuit also generates the output signal in response to the trigger output signal and the reference clock signal.

2. An apparatus as in claim 1, wherein the charge circuit includes a first current source circuit and a first switch circuit that are arranged to produce a charging current when the first switch is activated by the first control signal.

3. An apparatus as in claim 1, wherein the discharge circuit includes a second current source circuit and a second switch circuit that are arranged to produce a discharging current when the second switch is activated by the second control signal.

4. An apparatus as in claim 1, wherein the first capacitance circuit includes at least two capacitors that are series connected between a first and second power supply node.

5. An apparatus as in claim 1, wherein the discharge circuit is active during a first time period and the charge circuit is active during a second time period that is different from the first time period.

6. An apparatus as in claim 5, wherein the trigger output signal of the detector circuit transitions from one logic level to another logic level during the first time period.

7. An apparatus as in claim 5, wherein the trigger output signal of the detector circuit transitions from one logic level to another logic level during the second time period.

8. An apparatus as in claim 5, wherein the rates by which the first capacitor circuit charges and the second capacitor circuit discharges are adjusted by a bias circuit such that the amount of charge and discharge remains the same for changes in the frequency of the reference clock signal.

9. An apparatus as in claim 1, wherein the first capacitance circuit and the second capacitance circuit share a total charge when the switch circuit is active such that a potential associated with the first capacitance circuit and another potential associated with the second capacitance circuit are substantially the same when the switch circuit is deactivated.

10. An apparatus as in claim 1, further comprising a power down circuit that is arranged to discharge one of the first and second capacitance circuits when the apparatus is disabled in a power down mode.

11. An apparatus as in claim 10, wherein the power down circuit includes a switching circuit that couples a node in one of the first and second capacitance circuits to one of a power supply potential and a ground potential when the switching circuit is active.

12. An apparatus as in claim 1, wherein the detector circuit includes at least one inverter circuit that is arranged to detect a potential level of a node in at least one of the first capacitance circuit and the second capacitance circuit.

13. An apparatus as in claim 1, wherein the first control signal and the second control signal are controlled by a common control signal.

14. An apparatus as in claim 13, wherein the common control signal is activated in response to a change in logic levels of the reference clock signal.

15. An apparatus as in claim 14, wherein the third control signal is an inverse logic level of the common control signal.

16. An apparatus as in claim 1, wherein the first control signal is activated in response to a change in logic levels of the trigger output signal, and the second control signal is activated in response to a change in logic levels of the reference clock signal.

17. An apparatus as in claim 1, wherein the discharge circuit is deactivated in response to a change in logic levels of the trigger output signal.

18. A method of generating a high frequency clock signal from a reference clock signal, comprising:
   charging a capacitance circuit over a time interval;
   transferring a portion of a charge from the capacitance circuit to another capacitance circuit over another time interval;
   discharging one of the capacitance circuits over yet another time interval;
   detecting a potential in one of the capacitance circuits to produce a logic output; and
   combining the logic output with the reference clock signal to generate the high frequency clock.

19. A method of generating a high frequency clock as in claim 18, further comprising discharging one of the capacitance circuits when a power down condition is active.

20. A method of generating a high frequency clock as in claim 18, further comprising adjusting the rates of charging a capacitance circuit and discharging one of the capacitance circuits with a bias circuit such that the amount of charge and discharge remains approximately the same for changes in the frequency of the reference clock signal.

21. An apparatus for generating a high frequency clock signal from a reference clock signal, comprising:

a charge storage means;

a means for producing a current;

a means for selectively coupling the current to the charge storage means during a time interval;

another charge storage means;

a means for selectively coupling a portion of a charge stored in the charge storage means to the another charge storage means during another time interval;

a means for producing a logic signal by detecting a potential of a node in one of the charge storage means and the another charge storage means;

a means for selectively discharging the node that is responsive to the logic signal; and a means for producing the high frequency clock signal responsive to the logic signal.

22. An apparatus as in claim 21, further comprising means for discharging the node when a power down condition is detected.

23. An apparatus as in claim 21, further comprising means for proportionally adjusting the current produced by the current means for changes in the frequency of the reference clock signal.

* * * * *